United States Patent
Lin et al.

(10) Patent No.: US 11,769,786 B2
(45) Date of Patent: Sep. 26, 2023

(54) LED DISPLAY SCREEN AND MANUFACTURING METHOD THEREFOR

(71) Applicant: SHENZHEN TCL NEW TECHNOLOGY CO., LTD., Shenzhen (CN)

(72) Inventors: Jianyuan Lin, Shenzhen (CN); Chonghui Luo, Shenzhen (CN)

(73) Assignee: Shenzhen TCL New Technology Co., Ltd., Shenzhen (CN)

( * ) Notice: Subject to any disclaimer, the term of this patent is extended or adjusted under 35 U.S.C. 154(b) by 522 days.

(21) Appl. No.: 17/257,449

(22) PCT Filed: Jul. 23, 2019

(86) PCT No.: PCT/CN2019/097334
§ 371 (c)(1),
(2) Date: Dec. 31, 2020

(87) PCT Pub. No.: WO2020/020176
PCT Pub. Date: Jan. 30, 2020

(65) Prior Publication Data
US 2021/0225931 A1    Jul. 22, 2021

(30) Foreign Application Priority Data
Jul. 25, 2018   (CN) .......................... 201810827538.8

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/005* (2013.01); *H01L 33/486* (2013.01); *H01L 33/62* (2013.01); *H01L 2933/0066* (2013.01)

(58) Field of Classification Search
CPC ... H01L 27/156; H01L 33/005; H01L 33/486; H01L 33/62; H01L 2933/0066; H01L 51/524; H01L 51/5237; H01L 27/326
See application file for complete search history.

(56) References Cited

U.S. PATENT DOCUMENTS

| 2007/0290613 A1 | 12/2007 | Choi et al. |
| 2010/0220463 A1* | 9/2010 | Kim .......................... F21K 9/20 |
| | | 362/97.3 |

(Continued)

FOREIGN PATENT DOCUMENTS

| CN | 101937926 A | 1/2011 |
| CN | 102610631 A | 7/2012 |

(Continued)

OTHER PUBLICATIONS

The World Intellectual Property Organization (WIPO) International Search Report for PCT/CN2019/097334 dated Sep. 30, 2019 8 Pages (including translation).

(Continued)

*Primary Examiner* — David Vu
*Assistant Examiner* — Brandon C Fox
(74) *Attorney, Agent, or Firm* — Nathan & Associates; Menachem Nathan (57) ABSTRACT

An LED display screen and a manufacturing method therefor. The method comprises: presetting a temporary jig consisting of a first substrate (1) having a plurality of placement grooves, and a cover plate (3), and alternately placing R, G, and B-color LEDs in the placement grooves (2) by means of placement groove inlets (4); attaching a side cover to the temporary jig, and replacing the cover plate with an LED substrate and attaching the LEDs to the LED substrate; removing the first substrate and the side cover and sealing (Continued)

the LED substrate, and connecting a circuit board to the LED substrate, so as to obtain the LED display screen.

15 Claims, 7 Drawing Sheets

(51) Int. Cl.
*H01L 33/48* (2010.01)
*H01L 33/62* (2010.01)

(56) References Cited

U.S. PATENT DOCUMENTS

| | | | |
|---|---|---|---|
| 2018/0192495 A1 | 7/2018 | Kim et al. | |
| 2019/0157523 A1* | 5/2019 | Hong | H01L 27/1262 |
| 2022/0299823 A1* | 9/2022 | Li | G02F 1/133611 |

FOREIGN PATENT DOCUMENTS

| | | |
|---|---|---|
| CN | 103413897 A | 11/2013 |
| CN | 104576707 A | 4/2015 |
| CN | 104576967 A | 4/2015 |
| CN | 105720179 A | 6/2016 |
| CN | 106229421 A | 12/2016 |
| CN | 106784382 A | 5/2017 |
| CN | 108010994 A | 5/2018 |
| GB | 2383192 A | 6/2003 |
| JP | S61256773 A | 11/1986 |
| JP | 2000100562 A | 4/2000 |
| KR | 20110104588 A | 9/2011 |

OTHER PUBLICATIONS

The extended European search report dated Apr. 4, 2022 from European patent application No. 19841475.7.

* cited by examiner

LED DISPLAY SCREEN AND MANUFACTURING METHOD THEREFOR

CROSS-REFERENCES TO RELATED APPLICATIONS

This application is a national stage application of PCT Patent Application No. PCT/CN2019/097334, filed on Jul. 23, 2019, which claims priority to Chinese Patent Application No. 201810827538.8, filed on Jul. 25, 2018, the content of all of which is incorporated herein by reference.

FIELD OF THE INVENTION

The disclosure relates to the field of display screens, in particular to an LED display screen and a manufacturing method therefor.

BACKGROUND

With the development of LED (Light Emitting Diode) display screen, the characteristics of MINI LED or MICRO LED display screen such as high brightness, high contrast, ultra-high resolution and color saturation have been paid with more attention. The MINI LED or MICRO LED display screen is composed of a plurality of LED (R, G, B) arrays, and each LED can be independently driven, so that the MINI LED or MICRO LED display screen also has the advantages of power saving, high reaction speed and the like. However, at present, in the manufacturing process of the MINI LED or MICRO LED display screen, the LEDs need to be clamped and placed on the PCB one by one, and the LED welding pins are accurately aligned with the PCB (Printed Circuit Board) welding pads, so that on one hand, the technology and the manufacturing precision of manufacturing personnel are required to be high, and on the other hand, when a large amount of LEDs are transferred, a large amount of time needs to be divided through manual bonding alignment, so that the production efficiency of the MINI LED or MICRO LED display screen is low.

BRIEF SUMMARY OF THE DISCLOSURE

In view of the defects of the prior art, the disclosure aims to provide an LED display screen and a manufacturing method therefor, which can quickly realize LED transfer and accurately realize bonding alignment of LEDs.

The technical solution adopted by the application is as follows:

A manufacturing method of an LED display screen, comprising:
  presetting a temporary jig consisting of a first substrate with a plurality of placement grooves and a cover plate, and alternately placing three-color LEDs of R (Red), G (Green) and B (Blue) in the placement grooves through inlets of the placement grooves, wherein the colors of the LEDs in the same placement groove are the same;
  attaching the temporary jig with a side cover, replacing the cover plate by an LED substrate, and attaching each LED to the LED substrate at a same time;
  replacing the first substrate by a transparent layer, removing the side cover and sealing the LED substrate at a same time, and connecting a circuit board with the LED substrate to manufacture the LED display screen.

As a further improved technical solution, attaching the temporary jig with a side cover, replacing the cover plate by an LED substrate, and attaching each LED to the LED substrate comprises:
  attaching the temporary jig with the side cover and removing the cover plate, wherein the side cover covers inlets of the placement grooves;
  pressing the LED substrate with a conductive adhesive layer on the first substrate, arranging the LED substrate on a side of LED away from the first substrate and electrically connecting the LED substrate with each LED through the conductive adhesive layer.

As a further improved technical solution, replacing the first substrate by a transparent layer, removing the side cover and sealing the LED substrate at a same time, and connecting a circuit board with the LED substrate to manufacture the LED display screen comprises:
  removing the first substrate and the side cover, and coating the LED substrate with sealant along a circumferential direction to perform side screen sealing on the LED substrate;
  manufacturing the LED display screen by adopting a transparent layer to seal the LED substrate on upper side and connecting the circuit board with the LED substrate, wherein the transparent layer covers a light emitting surface of the LED.

As a further improved technical solution, the transparent layer is one of a transparent glass or a thin film.

As a further improved technical solution, the cover plate and the first substrate form a side opening box structure, and the plurality of placement grooves are located in the box structure and are all communicated with the side opening.

As a further improved technical solution, the first substrate comprises a first substrate body, a plurality of first side plates arranged in parallel around the first substrate body, and a second side plate arranged perpendicular to the first side plate; a plurality of baffle plates are arranged on the first substrate body along an extension direction of the first side plate, and the baffle plates and the first side plates form a plurality of placement grooves.

As a further improved technical solution, light emitting surfaces of the three-color LEDs of R, G and B are attached to the first substrate body.

As a further improved technical solution, an amount of the plurality of placement grooves is a multiple of three.

As a further improved technical solution, at least one LED is placed in the placement groove, and an amount of the LEDs placed in each placement groove is the same.

As a further improved technical solution, the LED substrate further comprises a metal wire layer and a second substrate, the conductive adhesive layer, the metal wire layer and the second substrate are sequentially stacked, and each LED is fixed on the second substrate through the conductive adhesive layer and electrically connected with the metal wire layer.

As a further improved technical solution, the conductive adhesive layer is an ACF (Anisotropic conductive film) adhesive layer, and metal conductive particles are arranged in the ACF adhesive layer to electrically connect an LED pin with a metal layer through the metal conductive particles.

As a further improved technical solution, a size of the ACF adhesive layer is smaller than a size of the second substrate.

As a further improved technical solution, the screen sealing layer for sealing the LED substrate is arranged along a circumference of the LED array formed by the LEDs so as to seal the circumference of the LED array.

An LED display screen, wherein the LED display screen is manufactured by the manufacturing method of an LED display screen as described in one of the previous solutions.

As a further improved technical solution, the LED display screen comprises an LED array and an LED substrate, wherein the LED array is laminated on the LED substrate, the LED basically comprising a conductive adhesive layer, a metal wire layer and a second substrate, the conductive adhesive layer, the metal wire layer and the second substrate being sequentially stacked, the conductive adhesive layer being in contact with each LED, and each LED being attached to the second substrate through the conductive adhesive layer.

The LED is placed in the placement groove of the temporary jig, the cover plate of the temporary jig is replaced by the LED substrate, and the LED substrate is pressed with the LED, so that the LED is quickly connected with the LED substrate, and the production efficiency of the LED screen can be greatly improved.

BRIEF DESCRIPTION OF THE DRAWINGS

Embodiments of the present disclosure will now be further described with reference to the accompanying drawings, in which.

DETAILED DESCRIPTION OF EMBODIMENTS

The application provides an LED display screen and a manufacturing method therefor, in order to make the purpose, technical solution and effect of the application clearer and more definite, the application is described in further detail below. It should be understood that the embodiments described herein are merely illustrative of the present application and are not intended to be limiting therefor.

Figure 1:
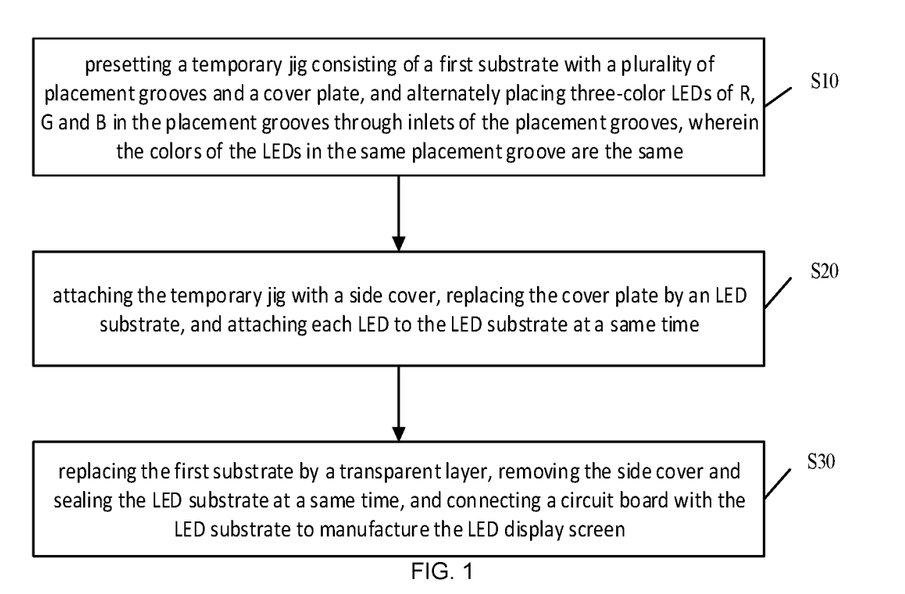
FIG. 1 is a flow diagram of one embodiment of a manufacturing method of an LED display screen provided by the present application.

The embodiment of the disclosure provides a manufacturing method of an LED display screen, which is illustrated in FIG. 1 and comprises the following steps:

S10, presetting a temporary jig consisting of a first substrate with a plurality of placement grooves and a cover plate, and alternately placing three-color LEDs of R, G and B in the placement grooves through inlets of the placement grooves, wherein the colors of the LEDs in the same placement groove are the same;

S20, attaching the temporary jig with a side cover, replacing the cover plate by an LED substrate, and attaching each LED to the LED substrate;

S30, replacing the first substrate by a transparent layer, removing the side cover, sealing the LED substrate, and connecting a circuit board with the LED substrate to manufacture the LED display screen.

According to the disclosure, the three-color LEDs of R, G and B are sequentially placed into each placement groove of the temporary jig, the three-color LEDs of R, G and B are fixed through the temporary jig, and then the cover plate is replaced by the LED substrate which is laminated with the A plurality of three-color LEDs of R, G and B are simultaneously aligned with and laminated with the LED substrate, and the rapid transfer of the LED is realized, so that the production efficiency of the LED is improved.

Figure 2:
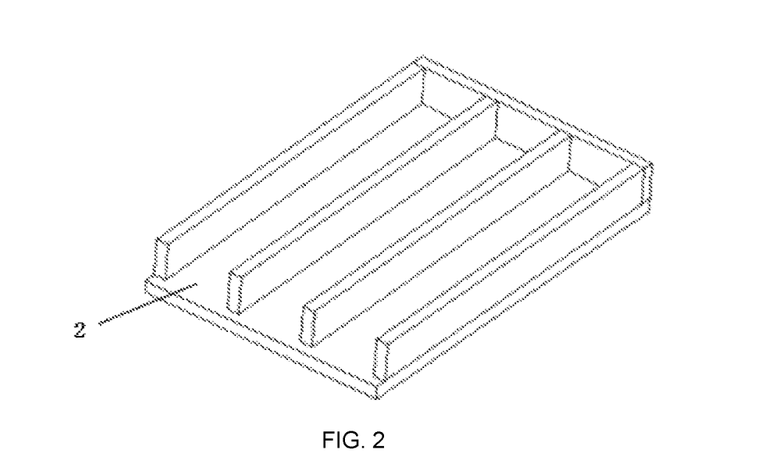
FIG. 2 is a schematic diagram showing the structure of a first substrate in the manufacturing method of an LED display screen provided by the present application.
Figure 3:
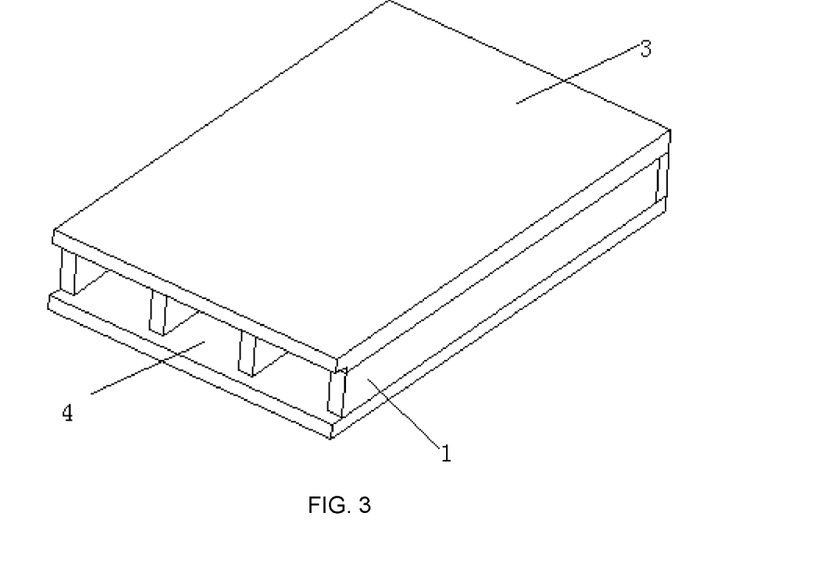
FIG. 3 is a schematic diagram showing the structure of a temporary jig in the manufacturing method of an LED display screen provided by the present application.

In the step S10, the temporary jig is a jig for manufacturing the LED display screen. As shown in FIGS. 2 and 3, the temporary jig comprises a first substrate 1 with a plurality of placement grooves 2, and a cover plate 3 detachably connected to the first substrate 1 and forming a box structure with a side opening with the first substrate 1, the plurality of placement grooves 2 being located in the box structure, and placement groove inlets 4 of each placement groove 2 communicating with the side openings. It is also possible to push the LEDs into the placement grooves 2 through the placement groove inlets 4 and position the LEDs through the placement grooves 2. In the embodiment, the first substrate 1 comprises a first substrate 1 body, two first side plates which are arranged in parallel and two second side plates which are arranged perpendicular to the first side plates, the first side plates and the second side plates being arranged around the first substrate 1 body. A plurality of baffle plates are arranged on the first substrate 1 body along an extension direction of the first side plate, and the baffle plates and the first side plates form a plurality of placement grooves 2. The first side plate, the second side plate and the plurality of baffle plates are all equal in height.

A width of the placement groove 2 is matched with a width of the LED to be placed, a groove depth of the placement groove 2 is matched with a thickness of the LED to be placed, and a length of the placement groove 2 can be determined according to a size of the LED display screen. The LED can thus be pushed into the placement groove 2 and can also be positioned by the placement groove 2. In this embodiment, the two adjacent placement grooves 2 may be separated by a baffle plate having a thickness equal to spacing between adjacent LEDs. Of course, in practical applications, the baffle plate between two adjacent placement grooves 2 can be replaced, that is, the baffle plate is detachably connected with the first substrate 1, so that the baffle plate can be replaced according to the interval requirement of LED of each color of the LED display screen to be processed, and the universality of the jig is improved.

Figure 4:
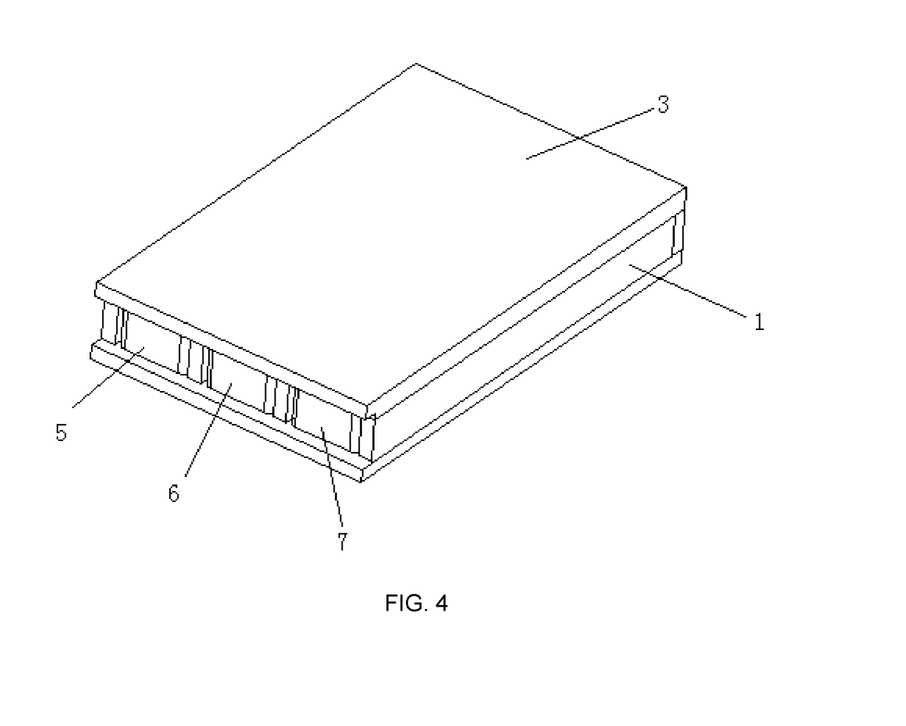
FIG. 4 is a schematic diagram of a temporary jig equipped with LEDs in the manufacturing method of an LED display screen provided by the present application.

Meanwhile, in the present embodiment, as shown in FIG. 4, the LEDs include R-color LEDs 5, G-color LEDs 6, and B-color LEDs 7. The three-color LEDs are alternately pushed into the placement grooves 2, at least one LED is placed in each placement groove 2, and the colors and the numbers of the LEDs placed in each placement groove 2 are the same. In practical applications, the plurality of placement grooves 2 can be ordered (for example, according to the placement order of the placement grooves 2). The R-color LEDs are sequentially pushed into the first ordered placement grooves 2. When the first ordered placement grooves 2 are filled, the G-color LEDs are sequentially pushed into the second ordered placement grooves 2, and when the second ordered placement grooves 2 are filled, B-color LEDs are sequentially pushed into the third ordered placement grooves 2. After the third ordered placement grooves 2 are filled, the process is repeated until all the placement grooves 2 are filled, so that the three-color LEDs of R, G and B (5, 6 and 7) can be uniformly arranged, and the color saturation of the LED display screen is improved. Further, in order to provide color saturation of the LED display screen, the number of LEDs of R, G and B colors of the LED display screen configuration is the same, that is, the number of the placement grooves 2 is a multiple of three. Of course, in a modified embodiment of the present embodiment, the color and the number of the LEDs placed in each of the placement grooves 2 and the arrangement of the three-color LEDs of R, G and B may be determined according to the placement relationship of the three-color LEDs of R, G and B in the LED display screen, which will not be described here.

Furthermore, when the LED is pushed into the placement groove 2, a light emitting surface of the LED faces towards the first substrate 1 body, so that the LED can be pushed into the placement groove 2 conveniently. A flatness of the light emitting surface of the LED is better than that of a welding pin surface, a friction force between the LED and the placement groove 2 can be reduced when the LED is pushed into the placement groove 2, and the LED can be pushed into the placement groove 2 conveniently. Meanwhile, abrasion to the welding pin surfaces of the LEDs in the pushing-in process can be reduced, the probability of poor contact between welding and a circuit board 12 is reduced, and the quality of the LEDs is improved.

Figure 5:
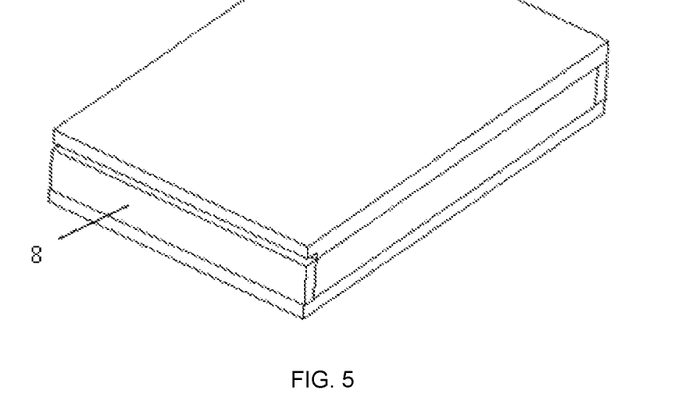
FIG. 5 is a schematic diagram showing the structure of the LED display screen after a side cover is attached in the manufacturing method of an LED display screen provided by the present application.
Figure 6:
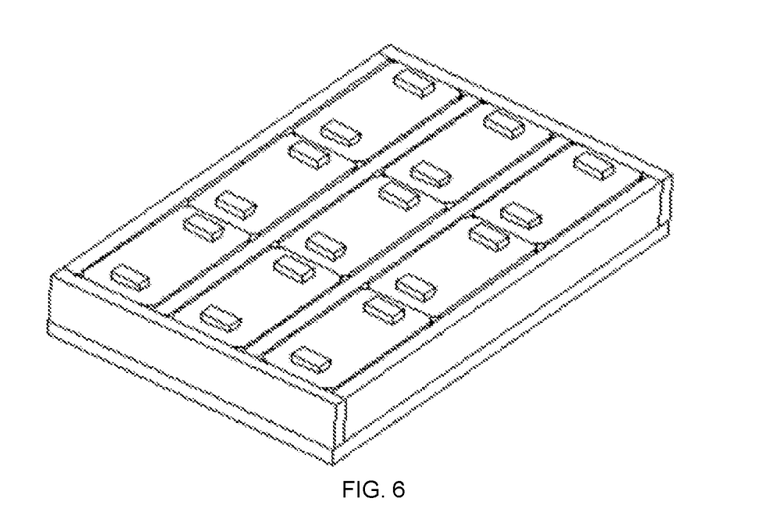
FIG. 6 is a schematic diagram of the LED display screen after a cover plate is removed in the manufacturing method of an LED display screen provided by the present application.

In the step S20, as shown in FIG. 5, the side cover 8 is used for covering the placement groove inlet 4 of the temporary jig. When the side cover 8 is attached to the temporary jig, the temporary jig is closed into a closed box body, and the LED is positioned in the closed box body. In addition, as shown in FIG. 6, after the side cover 8 is attached to the temporary jig, the cover plate 3 covered on the first substrate 1 is removed, so that the welding pin surfaces of the LEDs are exposed. This is because the light emitting surface of the LED faces the first substrate 1 body, the cover plate 3 covers the first substrate 1, and the LED is located in the box body formed by the first substrate 1 and the cover plate 3, so that the welding leg surface of the LED faces the cover plate 3, and when the cover plate 3 is removed, the welding leg surface of the LED is exposed.

As an example, attaching the temporary jig with a side cover, replacing the cover plate by an LED substrate, and attaching each LED to the LED substrate comprises:

S21, attaching the temporary jig with the side cover and removing the cover plate, wherein the side cover covers the inlet of the placement groove;

S22, pressing an LED substrate provided with a conductive adhesive layer on the first substrate, wherein the LED substrate is positioned on one side, far away from the first substrate, of the LED and is electrically connected with each LED through the conductive adhesive layer.

Figure 7:
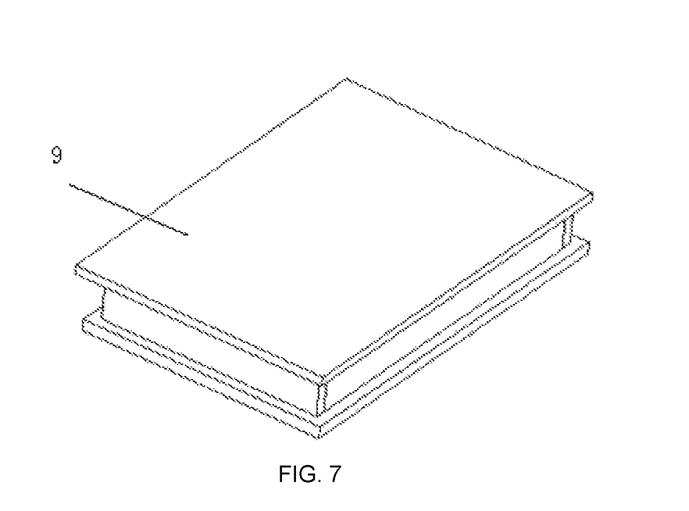
FIG. 7 is a schematic diagram of the LED display screen after an LED substrate is attached in the manufacturing method of an LED display screen provided by the present application.

As shown in FIG. 7, the LED substrate is provided with a conductive adhesive layer, the LED substrate 9 is mounted on the first substrate 1, the LED substrate 9 covers each LED and each LED is electrically connected with the LED substrate 9 through the conductive adhesive layer. That is, the bonding surface of the LED faces the LED substrate 9, and the bonding surface of the LED is in contact with the conductive adhesive layer. In addition, when the LED substrate 9 is mounted on the first substrate, the LED substrate 9 is pressed so that each LED is attached to the LED substrate 9.

Figure 8:
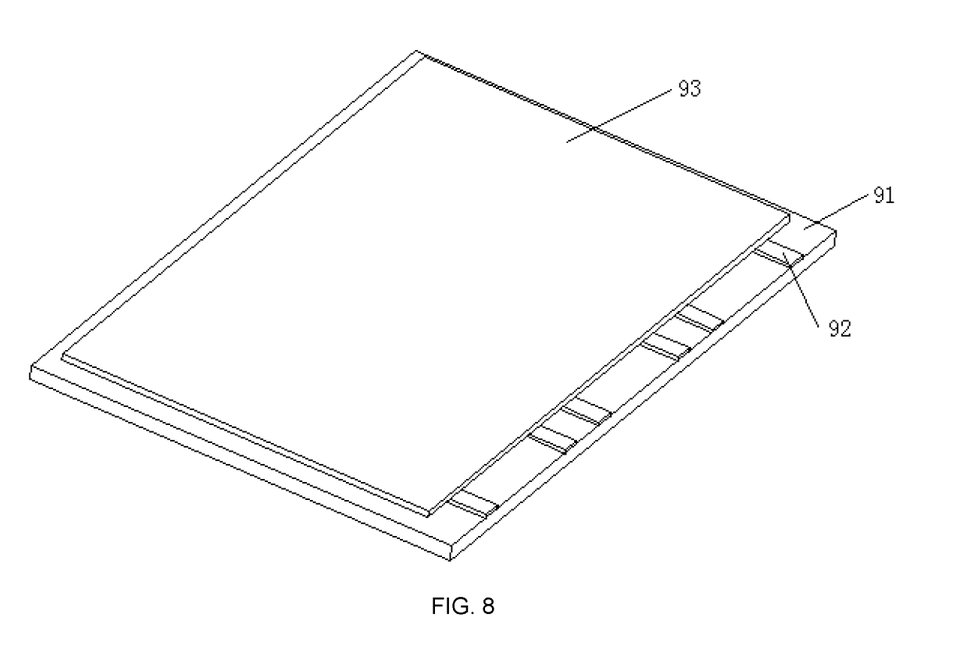
FIG. 8 is a schematic diagram showing the structure in a view angle of an LED substrate in the manufacturing method of an LED display screen provided by the present application.
Figure 9:
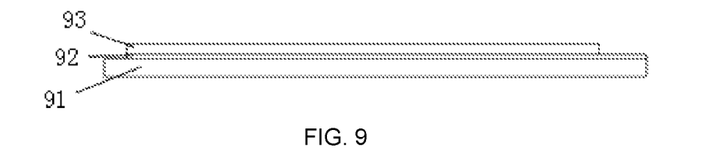
FIG. 9 is a schematic diagram showing the structure in another view angle of the LED substrate in the manufacturing method of an LED display screen provided by the present application.
Figure 10:
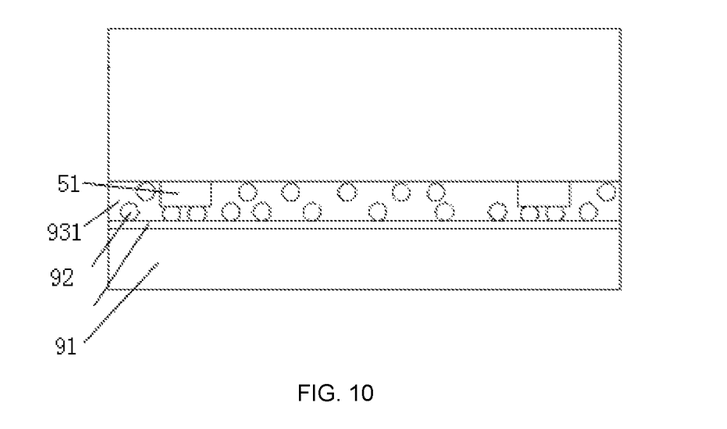
FIG. 10 is a schematic diagram showing the structure in another view angle of the LED substrate in the manufacturing method of an LED display screen provided by the present application.

As shown in FIGS. 8-10, the LED substrate 9 adopts a TFT substrate. the TFT substrate further comprises a metal wire layer 92 and a second substrate 91, and the conductive adhesive layer 93, the metal wire layer 92 and the second substrate 91 are sequentially stacked. The conductive adhesive layer 93 is in contact with the LEDs, and the LEDs are attached to the second substrate 91 through the conductive adhesive layer 93. The conductive adhesive layer 93 can adopt an ACF adhesive layer, AND metal conductive particles 931 are doped in the ACF adhesive layer. When the welding surface of the LED is attached to the second substrate 91 through the ACF adhesive layer, the welding pins 51 of the LED are embedded in the ACF adhesive layer, and the metal conductive particles 931 in the ACF adhesive layer are used as conduction to conduct with metal wires arranged on the second substrate 91. Therein, the second substrate 91 may have the metal wire layer 92 formed thereon by coating, developing, and etching. In addition, since sealant overflowing phenomenon occurs to the ACF adhesive layer in the pressing process, a size of the ACF adhesive layer is smaller than that of the second substrate 91, so that the ACF adhesive layer can be prevented from overflowing the second substrate 91 when the ACF adhesive layer is pressed.

Figure 11:
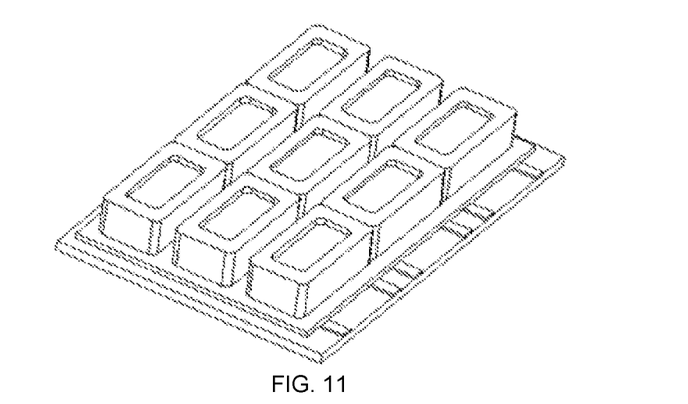
FIG. 11 is a schematic diagram showing the structure of the LED display screen after the first substrate and the side plate are removed in the manufacturing method of an LED display screen provided by the present application.
Figure 12:
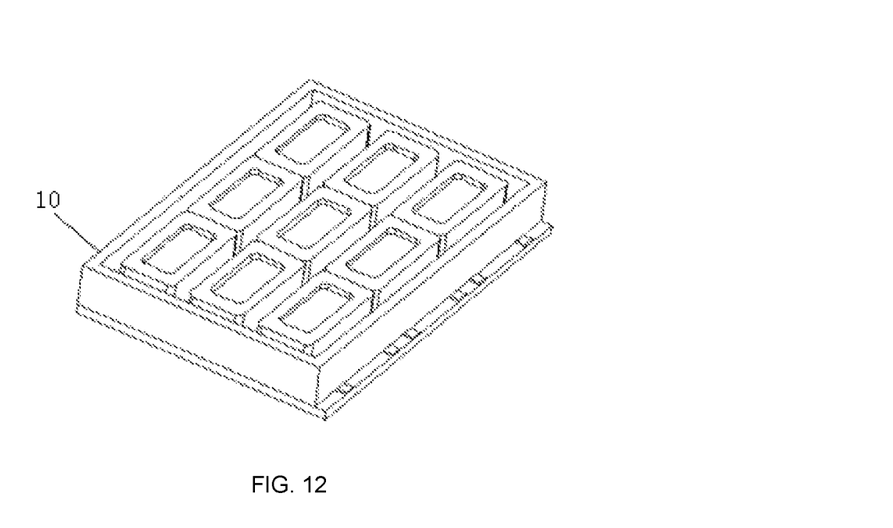
FIG. 12 is a schematic diagram of an LED display screen after a sealing layer is attached in the manufacturing method of an LED display screen provided by the present application.

Further, in the step S30, as shown in FIG. 11, the side cover 8 and the first substrate 1 are removed, leaving the LED attached to the LED substrate and the LED substrate 9. In addition, in order to fix the LEDs on the LED substrate 9 and seal the LEDs, as shown in FIG. 12, a screen sealing layer 10 formed by the sealing is arranged along a circumferential direction of the LED array formed by the LEDs so as to seal the circumferential direction of the LED array and prevent light rays generated by the LED array from leaking from the circumferential direction. In this embodiment, sealant may be used in the screen sealing, i.e. the LED substrate 9 is coated with the sealant.

As an example, replacing the first substrate by a transparent layer, removing the side cover, sealing the LED substrate, and connecting a circuit board with the LED substrate to manufacture the LED display screen comprises:

S31, removing the first substrate and the side cover, and performing side screen sealing on the LED substrate in the circumferential direction;

S32, manufacturing the LED display screen by adopting a transparent layer to seal the LED substrate on upper side and connecting the circuit board with the LED substrate, wherein the transparent layer covers a light emitting surface of the LED.

Figure 13:
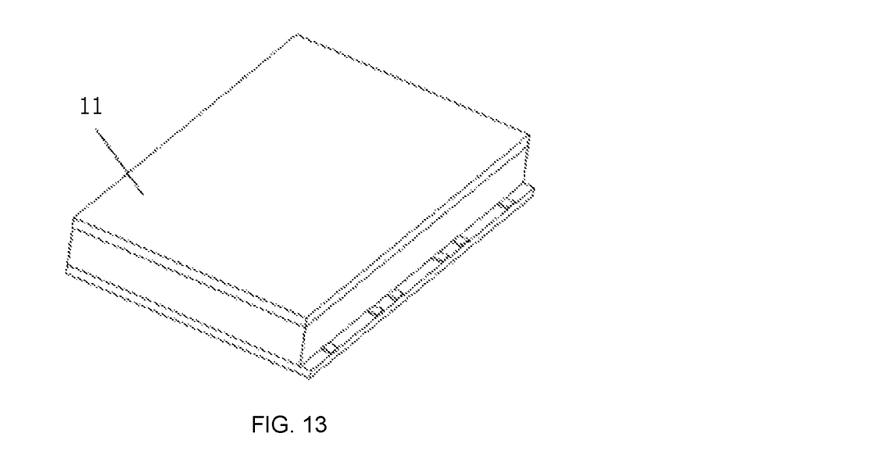
FIG. 13 is a schematic diagram of the LED display screen after a transparent layer is attached in the manufacturing method of an LED display screen provided by the present application.
Figure 14:
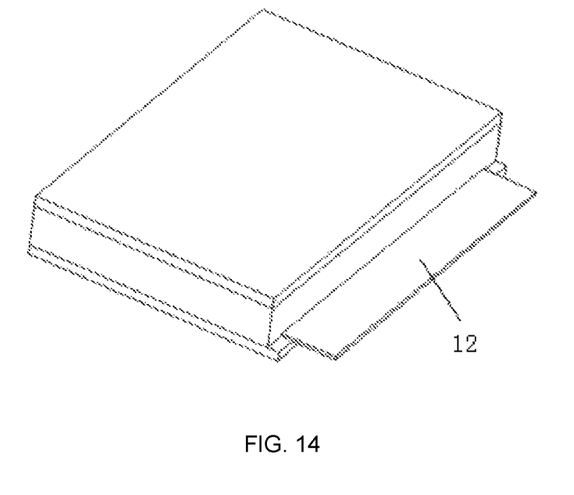
FIG. 14 is a schematic diagram showing the structure of an LED display screen provided by the present application.

As shown in FIG. 13, the transparent layer 11 covers the light emitting surface of the LEDs, covers and fixes the LEDs through the transparent layer 11, and light generated by the LEDs can be irradiated through the transparent layer 11, wherein the transparent layer 11 can be made of transparent glass or a transparent film. As shown in FIG. 14, the circuit board 12 is connected with the metal wire layer 92 of the LED substrate 9, and is connected with an external driver through the circuit board 12 to drive the display screen. Here, the circuit board 12 may be a PCB board or an FPC (Flexible Printed Circuit) line.

The application provides an LED display screen as shown in FIG. 14, wherein the LED display screen is prepared by adopting the manufacturing method of an LED display screen. The LED display screen comprises an LED array and an LED substrate, wherein the LED array is pressed on the LED substrate. As shown in FIGS. 9-11, the LED basically comprises a conductive adhesive layer 93, a metal wire layer 92 and a second substrate 91, wherein the conductive adhesive layer 93, the metal wire layer 92 and the second substrate 91 are sequentially stacked. The conductive adhesive layer 93 is in contact with the LEDs, and the LEDs are attached to the second substrate 91 through the conductive adhesive layer 93. The conductive adhesive layer 93 can adopt an ACF adhesive layer, AND metal conductive particles 931 are doped in the ACF adhesive layer. When the welding surface of the LED is attached to the second substrate basically through the ACF adhesive layer, the welding pins 51 of the LED are embedded in the ACF adhesive layer, and the metal conductive particles 931 in the ACF adhesive layer are used as conduction to conduct with metal wires arranged on the second substrate 91. Therein, the second substrate 91 may have the metal wire layer 92 formed thereon by coating, developing, and etching. In addition, since the size of the ACF adhesive layer is smaller than that of the second substrate due to the sealant overflowing phenomenon of the ACF adhesive layer in the pressing process, the ACF adhesive layer can be prevented from overflowing the second substrate 91 when the ACF adhesive layer is pressed.

In addition, the LED display screen further comprises a transparent layer 11 positioned on the light emitting surface of the LED array, and a screening sealing layer 10 arranged around the LED array, wherein the transparent layer 11 can be used for covering and fixing each LED, and light generated by each LED can be irradiated out through the transparent layer 11, wherein the transparent layer 11 can be made of transparent glass or a transparent film. The screen sealing layer 10 is used for fixing and sealing the circumferential direction of the LED array. In addition, the LED display screen further comprises a circuit board 12, wherein the circuit board 12 is connected with the metal wire layer 92 of the LED substrate and is connected with an external driver through the circuit board 12 to drive the display screen. Here, the circuit board 12 may be a PCB board or an FPC line.

It is to be understood that the application of the present application is not limited to the examples described above, and that modifications or variations may be resorted to in light of the teachings by those of ordinary skill in the art, all falling within the scope of the appended claims.

What is claimed is:

1. A manufacturing method of an LED display screen, comprising:
   presetting a temporary jig consisting of a first substrate with a plurality of placement grooves and a cover plate, and alternately placing three-color LEDs of R, G and B in the placement grooves through inlets of the placement grooves, wherein the colors of the LEDs in the same placement groove are the same;
   attaching the temporary jig with a side cover, replacing the cover plate by an LED substrate and attaching each LED to the LED substrate at a same time;
   replacing the first substrate by a transparent layer, removing the side cover and sealing the LED substrate at a same time, and connecting a circuit board with the LED substrate to manufacture the LED display screen.

2. The manufacturing method of an LED display screen according to claim 1, wherein attaching the temporary jig with a side cover, replacing the cover plate by an LED substrate, and attaching each LED to the LED substrate comprises:
   attaching the temporary jig with the side cover and removing the cover plate, wherein the side cover covers the inlet of the placement groove;
   pressing the LED substrate provided with a conductive adhesive layer on the first substrate, and electrically connecting the LED substrate with each LED through the conductive adhesive layer.

3. The manufacturing method of an LED display screen according to claim 1, wherein replacing the first substrate by a transparent layer, removing the side cover and sealing the LED substrate at a same time, and connecting a circuit board with the LED substrate to manufacture the LED display screen comprises:
   removing the first substrate and the side cover, and coating the LED substrate with sealant along a circumferential direction to perform side screen sealing on the LED substrate;
   manufacturing the LED display screen by adopting a transparent layer to seal the LED substrate on upper side and connecting the circuit board with the LED substrate, wherein the transparent layer covers a light emitting surface of the LED.

4. The manufacturing method of an LED display screen according to claim 3, wherein the transparent layer is one of a transparent glass or a thin film.

5. The manufacturing method of an LED display screen according to claim 1, wherein the cover plate and the first substrate form a side opening box structure, and the plurality of placement grooves are located in the box structure and are all communicated with the side opening.

6. The manufacturing method of an LED display screen according to claim 1, wherein the first substrate comprises a first substrate body, a plurality of first side plates arranged in parallel around the first substrate body, and a second side plate arranged perpendicular to the first side plate; a plurality of baffle plates are arranged on the first substrate body along an extension direction of the first side plate, and the baffle plates and the first side plates form a plurality of placement grooves.

7. The manufacturing method of an LED display screen according to claim 6, wherein light emitting surfaces of the three-color LEDs of R, G and B are attached to the first substrate body.

8. The manufacturing method of an LED display screen according to claim 1, wherein an amount of the plurality of placement grooves is a multiple of three.

9. The manufacturing method of an LED display screen according to claim 1, wherein at least one LED is placed in the placement groove, and an amount of the LEDs placed in each placement groove is the same.

10. The manufacturing method of an LED display screen according to claim 1, wherein the LED substrate further comprises a metal wire layer and a second substrate, the conductive adhesive layer, the metal wire layer and the second substrate are sequentially stacked, and each LED is fixed on the second substrate through the conductive adhesive layer and electrically connected with the metal wire layer.

11. The manufacturing method of an LED display screen according to claim 10, wherein the conductive adhesive layer is an ACF adhesive layer, and metal conductive particles are arranged in the ACF adhesive layer to electrically connect an LED pin with a metal layer through the metal conductive particles.

12. The manufacturing method of an LED display screen according to claim 11, wherein a size of the ACF adhesive layer is smaller than a size of the second substrate.

13. The manufacturing method of an LED display screen according to claim 1, wherein the screen sealing layer for sealing the LED substrate is arranged along a circumference of the LED array formed by the LEDs so as to seal the circumference of the LED array.

14. An LED display screen, wherein the LED display screen is manufactured by a manufacturing method of an LED display screen, comprising:
presetting a temporary jig consisting of a first substrate with a plurality of placement grooves and a cover plate, and alternately placing three-color LEDs of R, G and B in the placement grooves through inlets of the placement grooves, wherein the colors of the LEDs in the same placement groove are the same;
attaching the temporary jig with a side cover, replacing the cover plate by an LED substrate and attaching each LED to the LED substrate at a same time;
replacing the first substrate by a transparent layer, removing the side cover and sealing the LED substrate at a same time, and connecting a circuit board with the LED substrate to manufacture the LED display screen.

15. The LED display screen according to claim 14, comprising an LED array and an LED substrate, wherein the LED array is laminated on the LED substrate, the LED basically comprising a conductive adhesive layer, a metal wire layer and a second substrate, the conductive adhesive layer, the metal wire layer and the second substrate being sequentially stacked, the conductive adhesive layer being in contact with each LED, and each LED being attached to the second substrate through the conductive adhesive layer.

* * * * *